US010153271B2

(12) United States Patent
Li

(10) Patent No.: US 10,153,271 B2
(45) Date of Patent: Dec. 11, 2018

(54) ESD PROTECTION DEVICE AND METHOD

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/397,376

(22) Filed: Jan. 3, 2017

(65) Prior Publication Data
US 2017/0352653 A1 Dec. 7, 2017

(30) Foreign Application Priority Data
Jun. 1, 2016 (CN) .......................... 2016 1 0379423

(51) Int. Cl.
*H01L 27/02* (2006.01)
*H01L 29/78* (2006.01)
(Continued)

(52) U.S. Cl.
CPC .. *H01L 27/0274* (2013.01); *H01L 21/823814* (2013.01); *H01L 21/823821* (2013.01);
(Continued)

(58) Field of Classification Search
CPC ..... H01L 21/823842; H01L 21/823821; H01L 27/0924; H01L 27/270886;
(Continued)

(56) References Cited

U.S. PATENT DOCUMENTS 9,379,236 B2 * 6/2016 Ponoth .............. H01L 29/66681
2014/0092506 A1 * 4/2014 Ahsan ................... H01L 27/027
361/56

(Continued)

FOREIGN PATENT DOCUMENTS

| CN | 104576732 | 4/2015 | |
| EP | 2755238 | 7/2014 | |
| WO | WO 2017078676 A1 * | 5/2017 | ........... H01L 21/762 |

OTHER PUBLICATIONS

Ke et al., A New Dual-Material Gate LDMOS for RF Power Amplifiers, Solid-state and Integrated Circuit Technology, International conference on IEEE, Oct. 23, 2006, pp. 242-244.

(Continued)

Primary Examiner — Marcos D Pizarro
Assistant Examiner — Antonio Crite
(74) Attorney, Agent, or Firm — Kilpatrick Townsend & Stockton LLP

(57) ABSTRACT

An ESD protection device includes a substrate structure having a substrate, first and second fins, and first and second doped regions having different conductivity types. The first doped region includes a first portion of the substrate and a first region of the first fin, the second doped region includes a second portion of the substrate, a second region of the first fin adjacent to the first region and the second fin. The ESD device also includes a first gate structure on a surface portion of the first region and a surface portion of the second region of the first fin and including, from bottom to top, an interface layer on the surface portion of the first region and the surface portion of the second region of the first fin, a spacer, a high-k
(Continued)

dielectric layer, a first work-function adjusting layer, a second work-function adjusting layer, and a gate.

8 Claims, 4 Drawing Sheets

(51) Int. Cl.
    *H01L 21/8238*     (2006.01)
    *H01L 27/092*     (2006.01)
    *H01L 29/06*     (2006.01)
    *H01L 29/08*     (2006.01)
    *H01L 29/16*     (2006.01)
    *H01L 29/161*     (2006.01)
    *H01L 29/49*     (2006.01)
    *H01L 29/66*     (2006.01)

(52) U.S. Cl.
    CPC ............... *H01L 21/823842* (2013.01); *H01L 21/823878* (2013.01); *H01L 27/0255* (2013.01); *H01L 27/0924* (2013.01); *H01L 29/0653* (2013.01); *H01L 29/0847* (2013.01); *H01L 29/16* (2013.01); *H01L 29/161* (2013.01); *H01L 29/1608* (2013.01); *H01L 29/4966* (2013.01); *H01L 29/66545* (2013.01); *H01L 29/7816* (2013.01); *H01L 29/785* (2013.01)

(58) Field of Classification Search
    CPC ......... H01L 21/823814; H01L 27/0274; H01L 27/0255; H01H 9/046
    USPC ...................................... 361/56; 257/328, 77
    See application file for complete search history.

(56) References Cited

U.S. PATENT DOCUMENTS

| | | |
|---|---|---|
| 2015/0194419 A1 | 7/2015 | Singh et al. |
| 2016/0181358 A1* | 6/2016 | Zhang ............... H01L 29/66689 257/339 |
| 2017/0018551 A1* | 1/2017 | Ponoth ............... H01L 27/0924 |
| 2017/0243869 A1* | 8/2017 | Chang ............... H01L 27/0924 |

OTHER PUBLICATIONS

European Application No. 17173928.7, Extended European Search Report dated Oct. 26, 2017, 6 pages.

* cited by examiner

ESD PROTECTION DEVICE AND METHOD

CROSS-REFERENCES TO RELATED APPLICATIONS

This application claims priority to Chinese patent application No. 201610379423.8, filed on Jun. 1, 2016, the content of which is incorporated herein by reference in its entirety.

FIELD OF THE INVENTION

The present disclosure generally relates to semiconductor technology, and more particularly to electrostatic discharge (ESD) protection circuitry and semiconductor devices.

BACKGROUND OF THE INVENTION

Semiconductor integrated circuits are subject to serious damage caused by ESD events. As semiconductor features continue to decrease in sizes, supply voltages also continue to decrease. In relatively low power supply voltages (e.g., less than 6 V), shallow trench isolation (STI) diodes and gate-controlled diodes can be used as ESD protection devices. In relatively high power supply voltages (e.g., more than 6 V), gate-grounded N-type MOS (GGNMOS) transistors can be used as ESD protection devices.

However, for fin-type field effect transistor (FinFET) devices, the amount of generated hot carriers due to the small-size fin is insufficient to effectively trigger a GNNMOS transistor.

Thus, there is a need for a novel ESD protection structure for high voltage applications and method for manufacturing the same.

BRIEF SUMMARY OF THE INVENTION

Embodiments of the present disclosure provide a novel electrostatic discharge (ESD) protection device. The ESD protection device may include a substrate structure comprising a semiconductor substrate, a first fin and a second fin on the semiconductor substrate, and a first doped region and a second doped having different conductivity types. The first doped region includes a first portion of the semiconductor substrate and a first region of the first fin, and the second doped region includes a second portion of the semiconductor substrate, a second region of the first fin adjacent to the first region of the first fin, and the second fin. The ESD protection device also includes a first gate structure on a surface portion of the first region of the first fin and on a surface portion of the second region of the first fin. The first gate structure includes an interface layer on the surface portion of the first region of the first fin and on the surface portion of the second region of the first fin, a spacer on the first fin and adjacent the interface layer, a high-k dielectric layer on the interface layer and on opposite inner sidewalls of the spacer, a first work-function adjusting layer on a first portion of the high-k dielectric layer that is disposed on the surface portion of the first region of the first fin, a second work-function adjusting layer on the first work-function adjusting layer and on a second portion of the high-k dielectric layer that is on the surface portion of the second region of the first fin, and a gate on the second work-function adjusting layer. The ESD protection device further includes a first highly doped region in the first region and having a same conductivity type as a conductivity type of the first doped region and a doping concentration higher than a doping concentration of the first doped region, and a second highly doped region in the second fin and having a same conductivity type as a conductivity type of the second doped region and a doping concentration higher than a doping concentration of the second doped region.

In an embodiment, the first work-function adjusting layer comprises one of $Ti_xN_y$, TaN, and TaC; and the second work-function adjusting layer comprises one of TiAl, TiCAl, TiNAl, and TiSiAl.

In an embodiment, the first highly doped region is electrically connected to the gate of the first gate structure, and the second highly doped region is electrically connected to an input terminal for receiving an external signal.

In an embodiment, the first doped region is P-type, the second doped region is N-type, and the first highly doped region and the gate of the first gate structure are electrically connected to ground.

In an embodiment, the first gate structure is disposed on a portion of a surface of the first region of the first fin and a portion of a surface of the second region of the first fin.

In an embodiment, the first gate structure is disposed on a portion of a surface of the first region of the first fin and an entire surface of the second region of the first fin.

In an embodiment, the ESD protection device further includes a shallow trench isolation (STI) region disposed in the second doped region and between the first and second fins. The first gate structure is disposed on a portion of a surface of the first region of the first fin, on an entire surface and on a side surface of the second region of the first fin.

In an embodiment, the ESD protection device also includes a dummy gate structure disposed on a distal end portion of the first region that is not covered by the first gate structure, and the dummy gate is configured to define an opening of the first highly doped region. In an embodiment, the dummy gate includes a second interface layer on the distal end portion of the first region, a second spacer on the first fin and adjacent the second interface layer, a second high-k dielectric layer on the second interface layer and on an inner sidewall of the second spacer, and a dummy gate on the second high-k dielectric layer.

In an embodiment, the ESD protection further includes a second dummy gate structure disposed on a distal end portion of the second fin and configured to define an opening of the second highly doped region. The second dummy gate includes a third interface layer on the distal end portion of the second fin, a third spacer on the STI region and adjacent the second fin, a third high-k dielectric layer on the STI region, the third interface layer, and on an inner sidewall of the third spacer, and a dummy gate on the third high-k dielectric layer.

In an embodiment, the first and second highly doped regions each include SiGe, SiC, or Si.

In an embodiment, the ESD protection device may further include a third fin, and a third doped region adjacent to the second doped region and having a different conductivity type than the second doped region. The third doped region includes a third portion of the semiconductor substrate and a first region of the third fin on the third portion, a second region of the third fin on the second region of the semiconductor substrate and adjacent to the first region of the third fin, a second gate structure on a surface portion of the first region of the third fin and a surface portion of the second region of the third fin, and a third highly doped region in the first region of the third fin and having a same conductivity type as a conductivity type of the third doped region and a doping concentration higher than a doping concentration of the third doped region.

In an embodiment, the second gate structure includes a fourth interface layer on the surface portion of the first region of the third fin and the surface portion of the second region of the third fin, a fourth spacer on a portion of the third fin and adjacent the fourth interface layer, a fourth high-k dielectric layer on the fourth interface layer and on inner sidewalls of the fourth spacer, a first work-function adjusting layer on a first portion of the fourth high-k dielectric layer that is disposed on the surface portion of the first region of the third fin, a second work-function adjusting layer on the first work-function adjusting layer and on a second portion of the fourth high-k dielectric layer that is disposed on the surface portion of the second region of the third fin, and a gate on the second work-function adjusting layer of the second gate structure.

In an embodiment, the first highly doped region is electrically connected to the gate of the first gate structure, the second highly doped region is electrically connected to an input terminal for receiving an external signal, and the third highly doped region is electrically connected to the gate of the second gate structure.

Embodiments of the present invention also provide a semiconductor device having one or more of the ESD protection devices. The one or more ESD protection devices may include a first ESD protection device and a second ESD protection device, the first ESD protection device may be the same ESD protection device as described above, and the second ESD protection device may include a second substrate structure. The second substrate structure may include a second semiconductor substrate, a fourth fin and a fifth fin on the second semiconductor substrate, a fourth doped region and a fifth doped region having different conductivity types, the fourth doped region comprising a first portion of the second semiconductor substrate and a first region of the fourth fin, the fifth doped region comprising a second portion of the second semiconductor substrate, a second region of the fourth fin on the fifth doped region and adjacent to the first region of the fourth fin, and the fifth fin on the fifth doped region, and a third gate structure on a surface portion of the first region of the fourth fin and a surface portion of the second region of the fourth fin.

In an embodiment, the third gate structure may include an interface layer on the surface portion of the first region of the fourth fin and on the surface portion of the second region of the fourth fin, a spacer on the fourth fin and adjacent to the interface layer, a high-k dielectric layer on the interface layer and on opposite inner sidewalls of the spacer, a work-function adjusting layer on the high-k dielectric layer, and a gate on the work-function adjusting layer.

In an embodiment, the second ESD protection device may also include a fourth highly doped region in the first region of the fourth fin and having a same conductivity type as a conductivity type of the fourth doped region and a doping concentration higher than a doping concentration of the fourth doped region, and a fifth highly doped region in the fifth fin and having a same conductivity type as a conductivity type of the fifth doped region and a doping concentration higher than a doping concentration of the fifth doped region. The first doped region is P-type, the second doped region is N-type, the first highly doped region and the gate of the first gate structure are electrically connected to ground, the fourth doped region is N-type, the fifth doped region is P-type, the fourth highly doped region and the third gate structure are electrically connected to a power supply, the second highly doped region and the fifth highly doped region are electrically connected to each other and connected to an input terminal for receiving an external signal.

In an embodiment, the semiconductor device may further include an internal circuit electrically connected to the input terminal for receiving the external signal. The internal circuit includes a MOS transistor having a gate electrically connected to the external signal.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
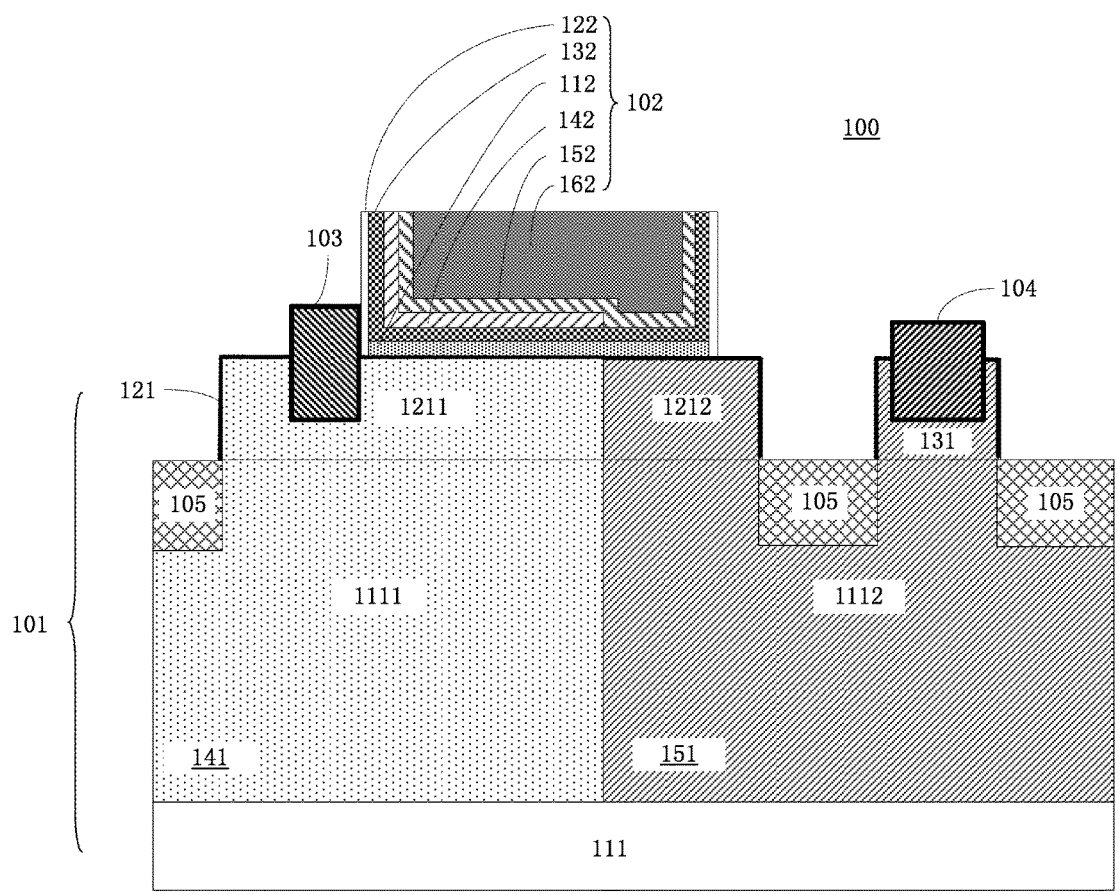
FIG. 1 is a cross-sectional view illustrating an ESD protection device according to an embodiment of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

As used herein, the term "highly doped region" refers to a region having doping level or concentration higher than a moderately doped region (alternatively referred to as doped region). The highly doped region may have a doping concentration in the range between $5\times10^{17}$ atoms/cm$^3$ to $5\times10^{19}$ atoms/cm$^3$, and the moderately doped region may have a doping concentration in the range between $5\times10^{15}$/cm$^3$ and $5\times10^{17}$/cm$^3$. When a conductivity type refers to an N-type semiconductor, then the opposite conductivity type is a P-type semiconductor.

In accordance with some embodiments of the present disclosure, an ESD protection device is provided for high voltage applications. FIG. 1 is a cross-sectional view illustrating an ESD protection device 100 according to some embodiments of the present disclosure. ESD protection device 100 may include a substrate structure 101.

FIG. 1 is a cross-sectional view illustrating an ESD protection device 100 according to an embodiment of the present disclosure. Referring to FIG. 1, ESD protection device 100 includes a substrate structure 101.

Substrate structure 101 includes a semiconductor substrate 111 (e.g., a silicon substrate) and at least two adjacent semiconductor fins on the semiconductor substrate. In an exemplary embodiment, the at least two adjacent semiconductor fins include a first fin 121 and a second fin 131 that are separate from each other. It is appreciate that the bottom surfaces of first fin 121 and second fin 131 are actually not visible in the cross-sectional view. However, for the sake of clarity, the bottom surfaces of first fin 121 and second fin 131 are shown in dotted lines.

Substrate structure 101 also includes a first doped region 141 and a second doped region 151 disposed laterally adjacent to each other and having different conductivity types. First doped region 141 includes a first portion 1111 of semiconductor substrate 111 and a first region 1211 of first fin 121 on first portion 1111. Second doped region 151 includes a second portion 1112 of semiconductor substrate 111 and a second region 1212 of first fin 121 and second 131 on second portion 1112. Second region 1212 of first fin 121 abuts first region 1211.

Referring to FIG. 1, ESD protection device 100 may further include a first gate structure 102 that extends along a portion of the surface of first region 1211 of first fin 121 and at least a portion of the surface of second region 1212 of first fin 121. In an embodiment, first gate structure 102 also includes an interface layer 112 (e.g., a silicon oxide layer) on at least a portion of the surface of first region 1211 of first fin 121 and at least a portion of the surface of second region 1212 of first fin 121. First gate structure 102 also includes a spacer 122 (e.g., a silicon oxide layer or a silicon nitride layer) adjacent to interface 112 on first fin 121, a high-k dielectric layer 132 on the interface layer 112 and opposite inner walls of spacer 122, and a first work-function adjusting layer 142 on high-k dielectric layer 132, which is disposed on a portion of the surface of first region 1211 of first fin 121. First work-function adjusting layer 142 includes a vertical portion on high-k dielectric layer 132 that is disposed on the surface of the inner sidewall of spacer 122 and a horizontal portion on high-k dielectric layer 132 that is disposed on interface layer 112 on first region 1211. First gate structure 102 further includes a second work-function adjusting layer 152 on a portion of first work-function adjusting layer 142 and on a portion of high-k dielectric layer 132. First gate structure 102 also includes a gate 162 (e.g., a polysilicon gate or a metal gate) on second work-function adjusting layer 152.

In a non-limiting exemplary embodiment, first work-function adjusting layer 142 may be a work function layer for a PMOS device and may include at least one of the following materials: $Ti_xN_y$ (e.g., TiN), TaN, or TaC. That is, the first work-function adjusting layer may include $Ti_xN_y$, TaN, TaC, or combinations of any two or three thereof. Second work-function adjusting layer 152 may be a work function layer for an NMOS device and may include at least one of the following materials: TiAl, TiCAl, TiNAl, or TiSiAl. That is, the second work-function adjusting layer may include TiAl, TiCAl, TiNAl, or TiSiAl, or combinations of any two or three thereof.

Further, ESD protection device 100 may also include a first highly doped region 103 and a second highly doped region 104. First highly doped region 103 is disposed in first region 1211 of first fin 121 and doped with the same conductivity type as that of first doped region 141, and has a doping concentration higher than the doping concentration of first doped region 141. Second highly doped region 104 is disposed in second fin 131 and has the same conductivity type as that of second doped region 151 with a doping concentration higher than the doping concentration of second doped region 151. It is to be understood that first highly doped region 103 disposed in first region 1211 of first fin 121 also includes the case where a portion of first highly doped region 103 is located in the first region 1211 of the first fin. Similarly, second highly doped region 104 disposed in second fin 131 also includes the case where a portion of second highly doped region 104 is located in the second fin. In a non-limiting exemplary embodiment, the first and second highly doped regions may include SiGe, SiC, or Si. For example, the first and second highly doped regions may be made of the same material including one of SiGe, SiC, and Si.

In an embodiment, ESD protection device 100 may also include a shallow trench isolation (STI) region 105 disposed on second doped region 151 between two fins. Specifically, STI region 105 may be disposed on second portion 1112 of semiconductor substrate 111. In addition, STI 105 may also be disposed on first doped region 141 between two fins, and more particular, on first portion 1111 of semiconductor substrate 111.

In the embodiment, the structure of the ESD protection device is similar to that of a laterally diffused metal oxide semiconductor (LDMOS) device, with one of the exceptions that the first highly doped region and the second highly doped regions have different conductivity types.

In a particular application, first highly doped region 103 in the ESD protection device of FIG. 1 may be electrically connected to gate 162 of the first gate structure, and second highly doped region 104 may be electrically connected to an input terminal for receiving an external signal. The external signal may enter an internal circuit that needs to be protected against ESD through the input terminal. That is, the ESD protection device is disposed in front of the internal circuit to protect the internal circuit against ESD.

In an embodiment, first doped region 141 may be a P-type doped region, and second doped region 151 may be an N-type doped region. First highly doped region 103 may be, for example, a P+-type doped region, and second highly doped region 104 may be, for example, an N+-type doped region. In this case, first highly doped region 103 and gate 162 in the first gate structure may be connected to a ground potential or ground (VSS), and second highly doped region 104 may be connected to the input terminal for receiving an external signal. The ESD protection device in the embodiment is similar to an LDNMOS device when a positive pulse voltage of the external signal is larger than a predetermined threshold voltage value, i.e., second highly doped region 104 has excessive positive charge accumulation, the ESD protection device is turned on, the positive charge will flow from the PN junction between first doped region 141 and second doped region 151 to first highly doped region 103, a current flows from second highly doped region 104 to first highly doped region 103, so that the positive pulse voltage larger than the predetermined threshold voltage value is not directly applied to the internal circuit, thereby protecting the internal circuit.

The present inventor discovered that, when the ESD protection device was turned on while the semiconductor device was in operation, a hot-carrier buildup occurred in the region of interface layer 112 of the first gate structure near second region 1212 of first fin 121, thus, causing damage to interface layer 112. The ESD protection device of the present invention includes first work-function layer 142 and second work-function layer 152 on first region 1211 of first fin 121, and second region 1212 of first fin 121 including second work-function layer 152, so that the threshold voltage of the ESD protection device is increased, so that second region 1212 of first fin 121 is not easily inverted, and the hot carrier generation region can be made relatively remote from interface layer 112, thereby reducing the possibility of hot carrier injection damage to interface layer 112.

Figure 2:
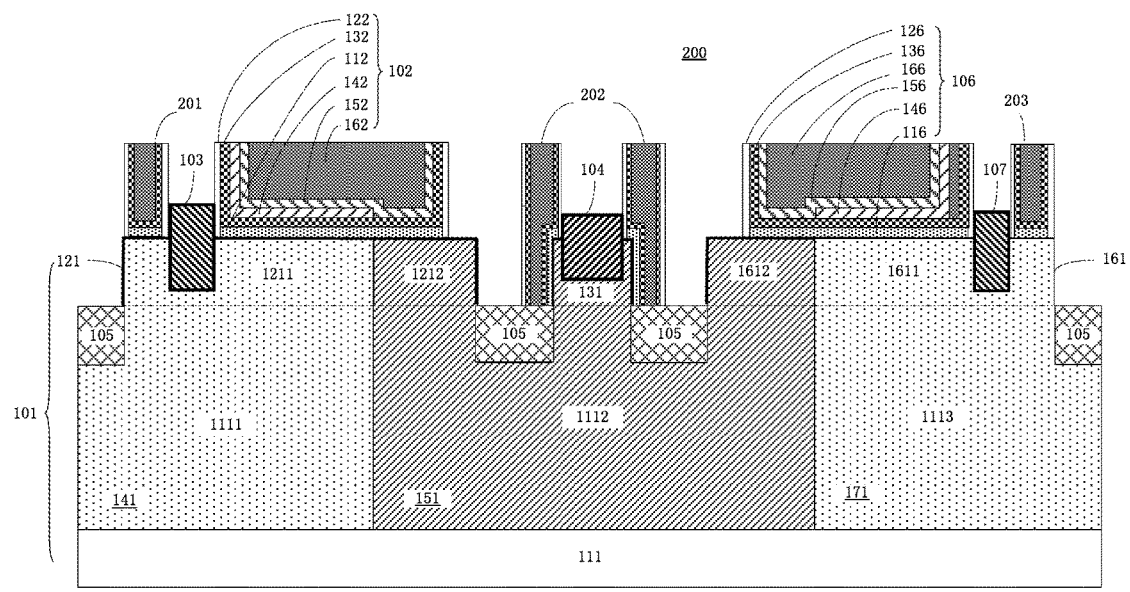
FIG. 2 is a cross-sectional view illustrating an ESD protection device according to another embodiment of the present disclosure.

FIG. 2 is a cross-sectional view illustrating an ESD protection device 200 according to another embodiment of the present disclosure. ESD protection device 200 includes a third fin 161 separated from first fin 121 and second fin 131. Substrate structure 101 also includes a third doped region 171 having a conductivity type different from the conductivity type of second doped region 151. In the embodiment, third doped region 171 includes a third portion 1113 and a first region 1611 on third fin 161. Comparing with ESD protection device 100 in FIG. 1, second doped region 151 also includes a second region 1612 of third fin 161 on second portion 1112 of substrate 111. Second region 1612 of third fin 161 is adjacent to first region 1611.

As shown in FIG. 2, ESD protection device 200 further includes a second gate structure 106 disposed on at least a portion of the surface of first region 1611 of third fin 161 and a portion of the surface of second region 1612 of third fin 161. In an embodiment, second gate structure 106 may be similar to first gate structure 102. In a specific embodiment, second gate structure 106 may include an interface layer 116 on at least a portion of the surface of first region 1611 of third fin 161 and on at least a portion of the surface of second region 1612 of third fin 161; the interface layer may include a silicon oxide layer. Second gate structure 106 may further include a spacer 126 on third fin 161 and adjacent to interface layer 116, a high-k dielectric layer 136 on interlayer 116 and on the surface of opposite inner walls of spacer 126, and a first work function adjusting layer 146 on a portion of the surface of first region 1611 of third fin 161. First work function adjusting layer 146 includes a vertical portion on high-k dielectric layer 136 that is on the surface of the inner walls of spacer 126 and a horizontal portion on high-k dielectric layer 136 that is on interface layer 116 that is on first region 1611. Second gate structure 106 further includes a second work function adjusting layer 156 on at least a portion of the surface of high-k dielectric layer 136 that is on the surface of second region 1612 of third fin 161 and on first work function adjusting layer 146. Second gate structure 106 further includes a gate 166 on second work function adjusting layer 156.

Referring still to FIG. 2, ESD protection device 200 further includes a third highly doped region 107 disposed in first region of third fin 161, third highly doped region 107 has the same conductivity type as that of third doped region 171 but with a higher doping concentration than that of third doped region 171.

In a particular embodiment, first highly doped region 103 of ESD protection device 200 may be electrically connected to gate 141 of first gate structure 102, second highly doped region 104 may be electrically connected to the input terminal for receiving the external signal, and third highly doped region 107 may be electrically connected to gate 166 of second gate structure 106.

The operation principle of ESD protection device 200 in FIG. 2 will be described as an example, in which first doped region 141 is P-type, second doped region 151 is N-type, and third doped region 171 is P-type.

In this case, first highly doped region 103 and second highly doped region, and third highly doped region 104 is N+-type. First highly doped region 102 and gate 142 of first gate structure 102 are electrically connected to ground (VSS), second highly doped region 104 may be electrically connected to an input terminal for receiving an external signal, third highly doped region 107 and gate 146 of second gate structure 106 may be electrically connected to ground (VSS). When a positive pulse voltage of the external signal is greater than a predetermined threshold value, i.e., second highly doped region 104 has an excessive positive charge accumulation, ESD protection device 200 is turned on, so that the excessive accumulated positive charge will flow from the PN junction of first doped region 141 and second doped region 151 and the PN junction of third doped region 171 and second doped region 151 to first highly doped region 103 and third highly doped region 107, and a current flows from second highly doped region 104 to first highly doped region 103 and third highly doped region 107. Thus, the positive pulse voltage that is larger than the predetermined threshold voltage value is not directly applied to the internal circuit, thereby protecting the internal circuit.

Comparing to ESD protection device 100 in FIG. 1, ESD protection device 200 in FIG. 2 can bleed current through two turned-on paths, thereby enabling a faster discharge of electrostatic current to achieve an improved protection of the internal circuit. Further, in the case where the second gate structure is similar to the first gate structure, ESD protection device 200 in FIG. 2 may also increase the threshold voltage of the device such that second region 1611 of third fin 161 cannot be easily inverted, and the hot carrier generation region may be relatively remote from interface layer 116, thereby reducing the possibility of hot carrier injection damage to interface layer 116 of the device.

In an embodiment, ESD protection device 200 may further include a dummy gate structure 201 disposed at the distal end portion of first region 1211, where first fin 121 is not covered by the first gate structure, to define an opening for forming first highly doped region 103, as shown in FIG. 2. In an embodiment, the dummy gate structure may include an interface layer (e.g., silicon oxide layer) on a distal end portion of the first region where the first fin is not covered by the first gate structure, a spacer (e.g., silicon oxide layer or a silicon nitride layer) adjacent to the interface layer on the first fin, a high-k dielectric layer on the interface layer and on the inner wall of the spacer, and a dummy gate (e.g., polysilicon) on the high-k dielectric layer.

In an embodiment, referring to FIG. 2, ESD protection device 200 may further include a dummy gate structure 202 disposed on STI region 105 and at the distal end of second fin 131 to define an opening for forming second highly doped region 104. In an embodiment, dummy gate structure 202 may include an interface layer on an end portion of the second fin, a spacer on the STI region and on the end of second fin for a dummy gate, a high-k dielectric layer on the interface layer and on the inner walls of the spacer, and a dummy gate on the high-k dielectric layer.

It is generally necessary to first etch the first fin and the second fin when forming first highly doped region 103 and second highly doped region 104, and then form first and second highly doped regions 103 and 104 by epitaxial growth. By forming dummy gate structures 201 and 202, the epitaxial micro-loading effect can be reduced.

It is to be appreciated that, in the case where the ESD protection device includes third fin 161 and second gate structure 106, a dummy gate structure 203 may also be formed on the distal end portion of third fin 161 that is not covered by the second gate structure, as shown in FIG. 2. Dummy gate structure 202 may be the same as dummy gate structure 201 and will not be described herein for the sake of brevity.

In each of the above-described embodiments, the first gate structure covers at least a portion of the second region of the first fin. ESD protection device 100 in FIG. 1 is the case where the first gate structure covers a portion of the second region of the first fin, i.e., the first gate structure is on a portion of the surface of the first region of the first fin and a portion of the surface of the second region of the first fin. Other implementations of the first gate structure will be described in detail below with reference to FIG. 3 and FIG. 4.

Figure 3:
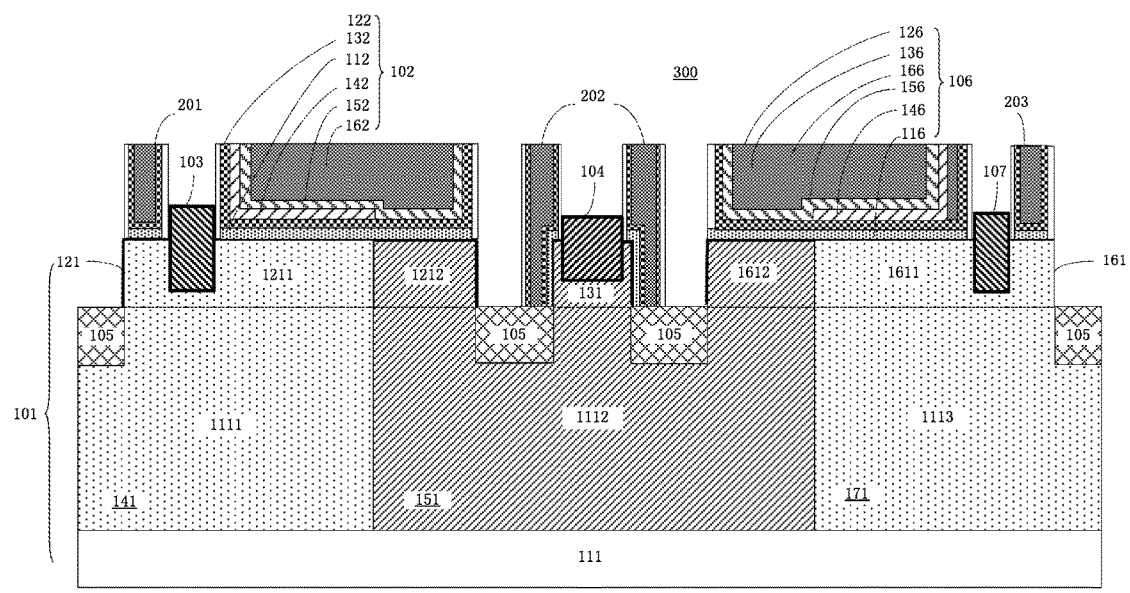
FIG. 3 is a cross-sectional view illustrating an ESD protection device according to yet another embodiment of the present disclosure.

FIG. 3 is a cross-sectional view illustrating an ESD protection device 300 according to yet another embodiment of the present disclosure. In the embodiment of FIG. 3, first gate structure 102 is formed on a portion of the surface of first fin region 1211 of first fin 121 and on the surface of second region 1212 of first fin 121, i.e., the surface of second region 1212 of first fin is completely covered by the first gate structure. Further, second gate structure 106 is on a portion of the surface of first region 1611 of third fin 161 and on a surface of second region 1612 of third fin 161.

Figure 4:
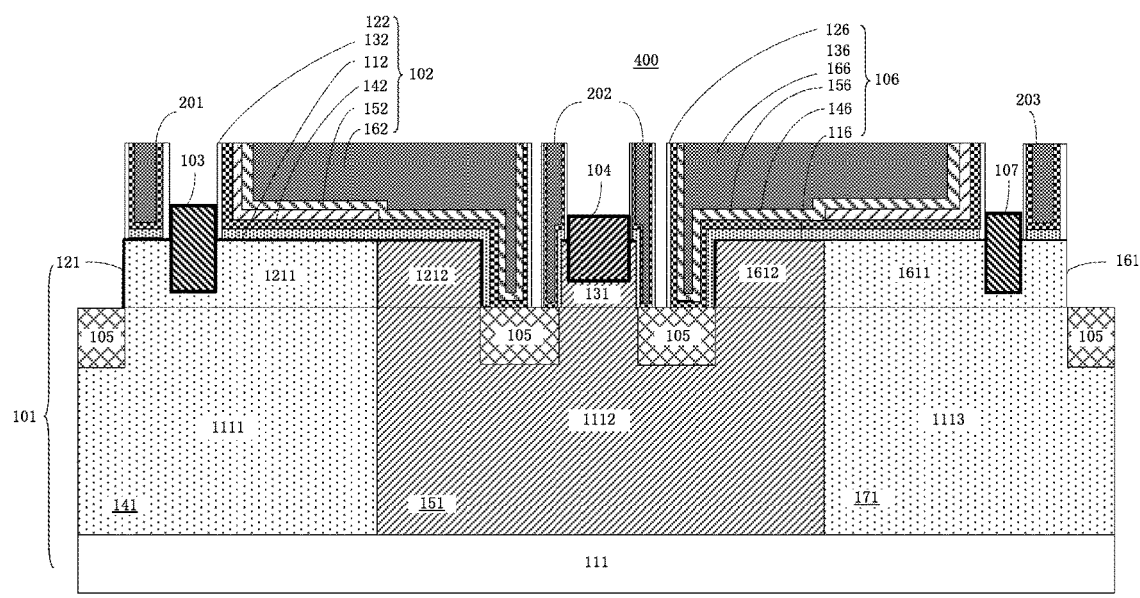
FIG. 4 is a cross-sectional view illustrating an ESD protection device according to still another embodiment of the present disclosure.

FIG. 4 is a cross-sectional view illustrating an ESD protection device 400 according to still another embodiment of the present disclosure. In the embodiment of FIG. 4, first gate structure 102 is formed on a portion of the surface of first fin region 1211 of first fin 121, on the surface of second region 1212 of first fin 121, and on a side surface of second region 1212 of first fin 12, i.e., first gate structure 102 not only convers the surface of second region 1212 of first fin, but also the surface of the sidewall of second region 1212. Further, second gate structure 106 is on a portion of the surface of first region of third fin 161, on the surface of second region 1612, and on a side surface of second region 1612.

It is to be understood that the ESD protection devices of FIG. 3 and FIG. 4 include multiple components in order to more fully illustrate the structure of the ESD protection device. However, it will be appreciated from the above description that some of the components are optional, e.g., dummy gate structures 201, 202, 203, etc.

In accordance with embodiments of the present invention, the ESD protection devices may be used in a variety of semiconductor devices, in particular, in FinFET devices. The ESD protection devices are suitable for FinFET device manufacturing processes and operable as high-voltage ESD protection devices. A semiconductor device may include one of the above-described ESD protection devices according to embodiments of the present invention.

Embodiments of the present disclosure thus provide ESD protection devices that can be used in a variety of semiconductor devices, in particular in FinFET devices. The ESD protection devices can be manufactured using the conventional FinFET manufacturing processes, and can be used for high voltage ESD protection.

Figure 5:
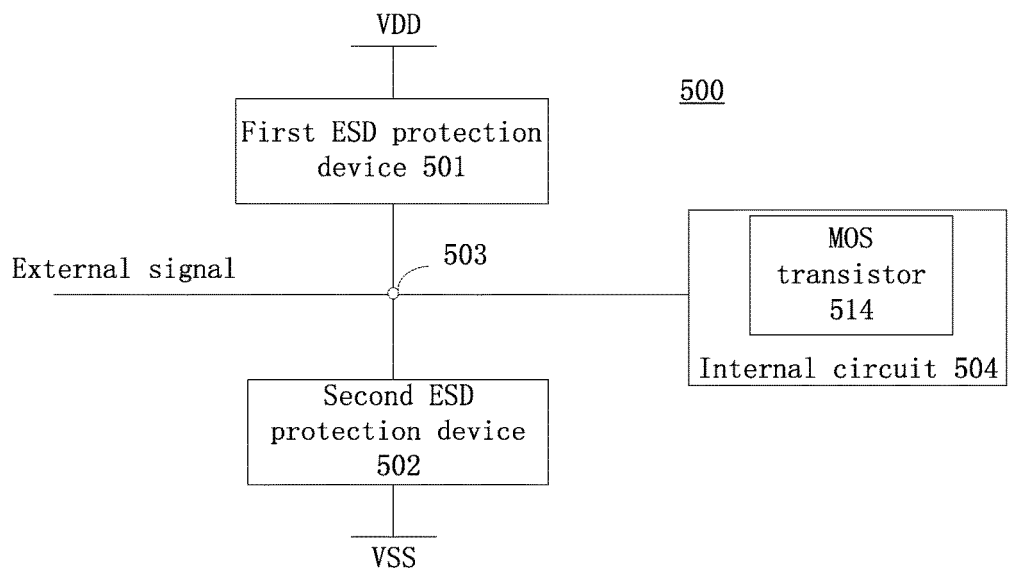
FIG. 5 is a block diagram of a semiconductor device according to embodiments of the present disclosure.

FIG. 5 is a simplified schematic block diagram of a semiconductor device structure 500 according to an embodiment of the present disclosure. As shown in FIG. 5, semiconductor device structure 500 includes a first ESD protection device 501 and a second ESD protection device 502. First ESD protection device 501 can be one of the ESD protection devices shown in FIGS. 1 through 4, whose structures have been described in detail above.

Figure 6:
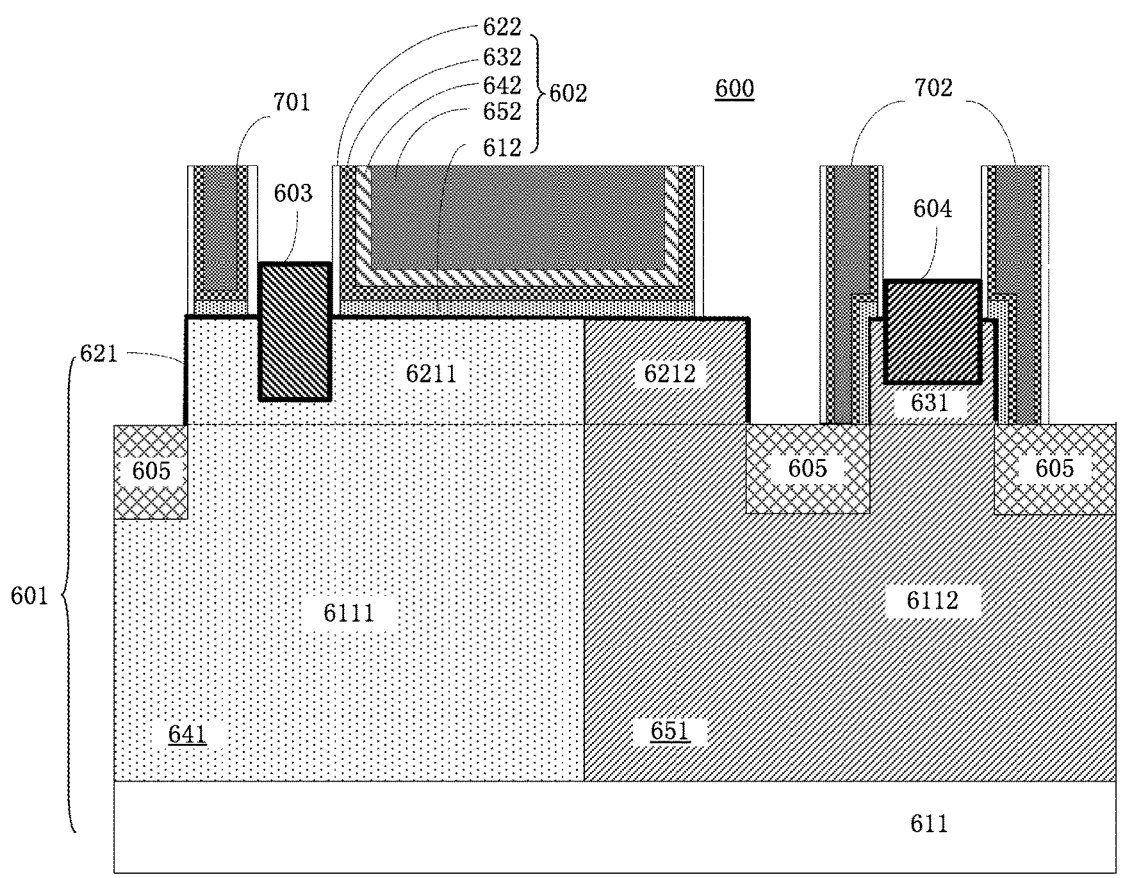
FIG. 6 is a cross-sectional view illustrating an ESD protection device used in the semiconductor device of FIG. 5.

FIG. 6 is a cross-sectional view illustrating an ESD protection device 600 according to an embodiment of the present invention. ESD protection device 600 is second ESD protection device 502 used in the semiconductor device of FIG. 5. As shown in FIG. 6, ESD protection device 600 may include a substrate structure 601. Substrate structure 601 includes a semiconductor substrate 611 (e.g., silicon substrate) and at least two semiconductor fins adjacent to semiconductor substrate 611, such as fourth fin 621 and fifth fin 631.

Substrate structure 601 includes a fourth doped region 641 and a fifth doped region 651 disposed laterally adjacent to each other and having different conductivity types. Fourth doped region 641 includes a first portion 6111 of substrate 611 and a first region 6211 of fourth fin 621. Fifth doped region 651 includes a second portion 6112 of substrate 611 and a second region 6212 of fourth fin 621. Fifth doped region 651 also includes a fifth fin 631. First region 6211 and second region 6212 of fourth fin 621 are adjacent to each other.

ESD protection device 600 (i.e., second ESD protection device 502 in FIG. 5) also includes a third gate structure 602 disposed on a portion of the surface of first region 6211 of fourth fin 621 and on a portion of the surface of second region 6212 of second region 6212. In an embodiment, third gate structure 602 may include an interface layer 612 (e.g., a silicon oxide layer) on a portion of the surface of first region 6211 of fourth fin 621 and a portion of the surface of second region 6212 of fourth fin 621. Third gate structure 602 also includes a spacer 622 (e.g., a silicon oxide layer, a silicon nitride layer) adjacent to interface 612 on fourth fin 621, a high-k dielectric layer 632 on the inner walls of interface layer 612 and spacer 622, and a work-function adjusting layer 642 on high-k dielectric layer 632, which is disposed on a portion of the surface of fourth region 6211 of fourth fin 621. Work-function adjusting layer 642 of third gate structure includes a vertical portion on high-k dielectric layer 632 that is disposed on the inner sidewall surface of spacer 622 and a horizontal portion on high-k dielectric layer 632 that is disposed on interface layer 612 on first region 6211 and second region 6212. Third gate structure 602 also includes a gate electrode 652 (e.g., a polysilicon gate, a metal gate) on work-function adjusting layer 642.

In a non-limiting exemplary embodiment, work-function adjusting layer 642 may be a work function layer for an NMOS device and may include at least one of the following materials: TiAl, TiCAl, TiNAl, or TiSiAl. That is, the first work-function adjusting layer may include TiAl, TiCAl, TiNAl, or TiSiAl, or combinations of any two or three thereof.

In addition, ESD protection device 600 (i.e., second ESD protection device 502 in FIG. 5) also includes a fourth highly doped region 603 and a fifth highly doped region 604. Fourth highly doped region 603 is disposed in first 6211 of fourth fin 621 and has the same conductivity type as that of fourth doped region 641 and a doping concentration higher than the doping concentration of fourth doped region 641. Fifth highly doped region 604 is disposed in fifth fin 631 and has the same conductivity type as that of fifth doped region 651 and a doping concentration higher than the doping concentration of fifth doped region 651.

In an embodiment, ESD protection device 600 (i.e., second ESD protection device 502) may also include a STI region 605 in second portion 6112 of semiconductor substrate 611 and between the fourth and fifth fins.

Further, ESD protection device 600 also includes a dummy gate structure 701 disposed on the distal end portion of first region 6211 that is not covered by the third gate structure, and a dummy gate structure 702 disposed on STI region 605 and on an end portion of fifth fin 631. Dummy gate structure 702 may be the same as dummy gate structure 202 and will not be described herein for the sake of brevity.

In accordance with the present disclosure, referring to FIG. 5, in first ESD protection device 501, the first doped region is doped with a P-type dopant, the second doped region is doped with an N-type dopant, first highly doped region 103 and gate 162 of first gate structure 102 are electrically connected to ground (VSS). In second ESD protection device 502, fourth doped region 641 is doped with an N-type dopant, fifth doped region 651 is doped with a P-type dopant, fourth highly doped region 603 and gate 652 of third gate structure 602 are electrically connected to the power supply (VDD). Further, second highly doped region 104 of first ESD protection device 501 is electrically connected to fifth highly doped region 604 of second ESD protection device 502, and second highly doped region 104 of first ESD protection device 501 and fifth highly doped region 604 of second ESD protection device 502 are electrically connected to a signal input terminal 503 that is configured to receive an external signal.

In accordance with the present disclosure, since the semiconductor device has first ESD protection device 501 and second ESD protection device 502, when the voltage level of the external signal exceeds a predetermined threshold voltage value, the ESD current can be discharged either through first ESD protection device 501 or second ESD protection device 502, thereby preventing static electricity from adversely affecting the performance of the semiconductor device. Further, the semiconductor device according to the present invention can have hot carrier generation regions relatively remote from interface layer 112 and interface layer 612, thereby reducing the possibility of hot carrier injection damage to interface layers 112 and 612.

In one embodiment, referring to FIG. 5, semiconductor device 500 may further include an internal circuit 504, the external signal is provided to internal circuit 504 through signal input terminal 503. In a specific embodiment, internal circuit 504 may include a metal oxide semiconductor (MOS) transistor 514; signal input terminal 503 is electrically connected to a gate of the MOS transistor, i.e., the external signal is applied to the gate of MOS transistor 514.

It should be understood that, in some embodiments, the semiconductor device may include one of the ESD protection devices shown in FIGS. 1 through 4 and other ESD protection devices, for example, STI diodes or gated diodes, and the like.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:

1. An electrostatic discharge (ESD) protection device, comprising:
    a substrate structure comprising:
    a semiconductor substrate;
    a first fin and a second fin on the semiconductor substrate;
    a first doped region and a second doped region having different conductivity types, the first doped region comprising a first portion of the semiconductor substrate and a first region of the first fin, the second doped region comprising a second portion of the semiconductor substrate, a second region of the first fin adjacent to the first region of the first fin, and the second fin;
    a first gate structure on a surface portion of the first region of the first fin and a surface portion of the second region of the first fin, the first gate structure comprising:
        an interface layer on the surface portion of the first region of the first fin and the surface portion of the second region of the first fin;
        a spacer on the first fin and adjacent the interface layer;
        a high-k dielectric layer on the interface layer and on opposite inner sidewalls of the spacer;
        a first work-function adjusting layer only on a first portion of the high-k dielectric layer that is on the surface portion of the first region of the first fin;
        a second work-function adjusting layer on the first work-function adjusting layer and on a second portion of the high-k dielectric layer that is on the surface portion of the second region of the first fin, wherein the second portion of the high-k dielectric layer does not have the first work-function adjusting layer disposed thereon; and a gate on the second work-function adjusting layer; and a first highly doped region in the first region and having a same conductivity type as a conductivity type of the first doped region and a doping concentration higher than a doping concentration of the first doped region; and a second highly doped region in the second fin and having a same conductivity type as a conductivity type of the second doped region and a doping concentration higher than a doping concentration of the second doped region.

2. The ESD protection device of claim 1, wherein:
the first work-function adjusting layer comprises one of $Ti_xN_y$, TaN, and TaC; and
the second work-function adjusting layer comprises one of TiAl, TiCAl, TiNAl, and TiSiAl.

3. The ESD protection device of claim 1, wherein the first gate structure is disposed on a portion of a surface of the first region of the first fin and a portion of a surface of the second region of the first fin.

4. The ESD protection device of claim 1, further comprising a shallow trench isolation (STI) region disposed in the second doped region and between the first and second fins.

5. The ESD protection device of claim 1, wherein the first and second highly doped regions each include SiGe, SiC, or Si.

6. A semiconductor device comprising one or more of ESD protection devices of claim 1.

7. The ESD protection device of claim 1, wherein:
the first highly doped region is electrically connected to the gate of the first gate structure; and
the second highly doped region is electrically connected to an input terminal for receiving an external signal.

8. The ESD protection device of claim 7, wherein:
the first doped region is P-type, the second doped region is N-type; and
the first highly doped region and the gate of the first gate structure are electrically connected to ground.

* * * * *